(12) United States Patent
Shabany

(10) Patent No.: US 7,430,117 B2
(45) Date of Patent: Sep. 30, 2008

(54) AIRFLOW SYSTEM FOR ELECTRONICS CHASSIS

(75) Inventor: Younes Shabany, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 57 days.

(21) Appl. No.: 11/383,153

(22) Filed: May 12, 2006

(65) Prior Publication Data

US 2007/0133168 A1    Jun. 14, 2007

Related U.S. Application Data

(60) Provisional application No. 60/750,217, filed on Dec. 14, 2005.

(51) Int. Cl.
*H05K 7/20* (2006.01)
(52) U.S. Cl. ............... 361/695; 361/687; 361/690; 454/184; 165/80.3
(58) Field of Classification Search .......... 361/687, 361/695, 724, 796; 165/80.3; 454/184
See application file for complete search history.

(56) References Cited

U.S. PATENT DOCUMENTS

| | | | |
|---|---|---|---|
| 4,502,100 A * | 2/1985 | Greenspan et al. ......... 361/695 |
| 6,236,564 B1 * | 5/2001 | Fan .......................... 361/695 |
| 6,388,879 B1 * | 5/2002 | Otaguro et al. ............ 361/695 |
| 6,388,880 B1 | 5/2002 | El-Ghobashy et al. |
| 6,535,382 B2 | 3/2003 | Bishop et al. |
| 6,594,148 B1 * | 7/2003 | Nguyen et al. ............. 361/695 |
| 6,604,916 B2 * | 8/2003 | Lu et al. .................... 417/360 |
| 6,690,576 B2 * | 2/2004 | Clements et al. ........... 361/695 |
| 6,714,411 B2 | 3/2004 | Thompson et al. |
| 6,791,836 B2 * | 9/2004 | Cipolla et al. .............. 361/687 |
| 6,813,152 B2 * | 11/2004 | Perazzo .................... 361/695 |
| 6,839,233 B2 | 1/2005 | Cravens et al. |
| 6,878,874 B2 | 4/2005 | Osborn et al. |
| 6,912,129 B2 | 6/2005 | Baker et al. |
| 6,932,696 B2 * | 8/2005 | Schwartz et al. ........... 454/184 |
| 6,961,242 B2 | 11/2005 | Espinoza-Ibarra et al. |
| 6,987,673 B1 | 1/2006 | French et al. |
| 7,016,193 B1 * | 3/2006 | Jacques et al. ............. 361/695 |
| 7,154,748 B2 * | 12/2006 | Yamada .................... 361/690 |
| 2003/0223193 A1 * | 12/2003 | Smith et al. ............... 361/687 |
| 2003/0227748 A1 * | 12/2003 | Chen et al. ................. 361/695 |
| 2003/0227757 A1 * | 12/2003 | Vincent et al. ............. 361/796 |
| 2004/0130868 A1 * | 7/2004 | Schwartz et al. ........... 361/687 |
| 2004/0264145 A1 | 12/2004 | Miller et al. |
| 2005/0024825 A1 * | 2/2005 | Smith et al. ............... 361/687 |
| 2005/0071689 A1 | 3/2005 | Coward et al. |
| 2005/0105271 A1 * | 5/2005 | Lu et al. .................... 361/695 |

(Continued)

*Primary Examiner*—Jayprakash N Gandhi
*Assistant Examiner*—Courtney L Smith
(74) *Attorney, Agent, or Firm*—Kent A. Lembke; Robert G. Crouch; Marsh, Fischmann & Breyfogle

(57) ABSTRACT

An electronics chassis is provided that utilizes multiple fan units, each of which may incorporate multiple fans, to improve airflow through an internal enclosure of the chassis. Various combinations of multiple fan units are utilized to increase airflow and provide redundancy in the event of the failure of one or more fans. In one arrangement, combinations of horizontally mounted and vertically mounted fans are utilized to improve airflow. In further arrangements, multiple access openings are provided into the enclosure such that an individual fan unit or an individual fan may be accessed for servicing purposes without altering or discontinuing the operation of other fans or fan units.

27 Claims, 7 Drawing Sheets

U.S. PATENT DOCUMENTS

| | | |
|---|---|---|
| 2005/0168945 A1* | 8/2005 | Coglitore .................... 361/695 |
| 2005/0286222 A1 | 12/2005 | Lucero et al. |
| 2006/0002080 A1* | 1/2006 | Leija et al. ................. 361/687 |
| 2006/0002084 A1 | 1/2006 | Wei |
| 2006/0203446 A1* | 9/2006 | Radhakrishnan et al. ..... 361/695 |
| 2007/0159790 A1* | 7/2007 | Coglitore et al. ............ 361/687 |
| 2007/0173189 A1* | 7/2007 | Lewis ........................ 454/184 |

* cited by examiner

AIRFLOW SYSTEM FOR ELECTRONICS CHASSIS

CROSS REFERENCE TO RELATED APPLICATION

This application claims priority under 35 U.S.C. §119 to U.S. Provisional Application No. 60/750,217 entitled "Airflow System for Electronics Chassis" having a filing date of Dec. 14, 2005, the entire contents of which are incorporated by reference herein.

FIELD

Generally, the utility disclosed herein is directed towards heat management in electronics enclosures. More specifically the utility is directed towards improved airflow in stackable electronics chassis.

BACKGROUND

Modern electronics, such as telecommunications equipment, are commonly contained in a housing or chassis. The chassis may serve many functions, including providing structural support for the contents, providing a common electrical ground, providing protection from electromagnetic interference (EMI), and others. For many applications (e.g., telecommunications centers, server farms, etc.) it has become common practice to stack multiple individual electronics chassis in specialized racks. Further, multiple racks may be arranged in a side-by-side manner. These arrangements allow for reducing the space required to house a large number of such electronics enclosures.

Within certain industries, there are standards organizations that have promulgated specifications for certain types of electronics chassis. One example of such an organization is the PCI Industrial Computer Manufacturers Group (PICMG) and an example of such a specification is PICMG 3.0 Rev. 2.0 or as further updated, and more commonly known, the Advanced Telecom Computing Architecture (ATCA) specification. The ATCA defines specifications for a standards-based telecommunications computing platform. It was developed by a cross-section of over 100 industry suppliers and telecom equipment manufacturers.

The ATCA defines an open switch fabric based platform delivering an industry standard in performance, fault tolerance, as well as a scalable solution for telecommunications and data center equipment. The base specification defines the physical and electrical characteristics of an off-the-shelf, modular chassis based on switch fabric connections between hot swappable blades. The ATCA base specification defines the boards form factors, core backplane fabric connectivity, power, management interfaces, and the electromechanical specifications of the boards. The electromechanical specification enables equipment from different vendors to be incorporated in a modular fashion while being guaranteed to operate.

Although the ATCA has provided a significant improvement with respect to providing standardized telecom and computer component interfaces and operability, several of the design specifications have failed to account for the growth in the processing speed and density of electronics board. For instance, the 200 W power dissipation per slot permitted by the specification places a restriction on how much heat can be generated by a board, while not defining the location of the heat sources. To meet ever-increasing bandwidth demands, processing speeds have increased faster than anticipated by the ATCA. Accordingly, as there is a direct relationship between speed and power consumption—the faster the processor speed, the higher the power consumption of the processor—a greater amount of heat must be dissipated by an ATCA chassis including boards having processors with faster processing speeds. In view of the rigid board form factors defined by the ATCA base specification, this leads to problems in achieving sufficient cooling for high-speed and high-power components such as processors, since the majority of the 200 W will be consumed by those components. Further, due to operation at the edge of current cooling capacity, even partial failure of the cooling system (e.g., one or more fans) may result in damaged components or undesired system shut down.

It is against this background that the present invention has been developed.

SUMMARY

In view of the foregoing, various systems and methods (i.e., utilities) are provided herein for improving airflow through electronics chassis including, without limitation, ATCA chassis.

According to a first aspect, a utility is provided that includes a chassis defined by an enclosure having four vertical sidewalls, a top surface and a bottom surface. An interior of the enclosure includes an upper plenum, a lower plenum and a section disposed between the plenums that is adapted to receive a plurality of electronics boards. A first access opening to the upper plenum may be utilized to access a first fan unit, which may be selectively removed through the first access opening. A second access opening to the upper plenum may be used to selectively access and/or remove a second fan unit. However, it will be further appreciated that in other arrangements each of the first and second fan units may be removed through either of the access openings.

In one arrangement, the first access opening is disposed through a first vertical sidewall of the chassis, and the second access opening is disposed through a second vertical sidewall. Further, these first and second sidewalls may be non-adjacent. For instance, the first and second vertical sidewalls may be the front and back walls of the electronics chassis. Each fan unit may include a plurality of individual fans. Each fan unit or each of the individual fans in a fan unit may be removable without terminating the operation of the remaining fans of the same fan unit or the other fan units. Further, each fan in such unit may be individually controlled.

In one arrangement, the first and second fan units may be disposed in tandem. In such an arrangement, the first and second fan units may be operative to move air in a direction that it substantially normal to a vertical sidewall of the chassis. That is, the fan units may be aligned with the vertical sidewall. In another arrangement, at least one of the fan units may be disposed horizontally relative to a vertical sidewall. In such an arrangement, the horizontal fan unit may be disposed above or below the electronic boards disposed within the chassis. In such an arrangement, the horizontal fan unit may be operative to move air in a direction substantially parallel to a vertical sidewall. That is, the horizontal fan unit may displace air into the upper plenum, and the other fan unit (e.g., a vertical fan unit) may exhaust air from the plenum through an air outlet.

Each access opening may include a panel that may be removably connected to and/or pivotable to the chassis. Further, each such panel may include one or more vent holes to allow the panel to be utilized as an air outlet.

According to another aspect, a utility is provided for servicing an electronics chassis. The utility includes accessing at least a first or second fan unit in an upper plenum of the electronics chassis. A first fan unit may be accessed through a first access opening to the upper air plenum, and the second fan unit may be accessed through a second access opening to the upper air plenum of the chassis. Once one of the fans units has been accessed, that fan unit may be serviced while the operation of the other fan unit may continue. Such servicing may include replacing the fan unit or replacing an individual fan or plurality of fans in the fan unit.

According to another aspect, a utility is provided that includes a chassis for holding a plurality of electronics boards disposed in parallel. In a first dimension, these electronics boards each extend vertically from a lower portion of the chassis to an upper portion of the chassis. The chassis also includes a bottom plenum that is associated with the lower portion of the chassis where the bottom plenum includes an air inlet. A top plenum is associated with the upper portion of the chassis and includes at least a first air outlet. A first fan unit is disposed in the top plenum substantially adjacent to the air outlet, and a second fan unit is horizontally aligned relative to at least a portion of the electronics boards.

In one arrangement, the first fan unit is vertically aligned relative to an air outlet that extends through a vertical sidewall of the electronics chassis. In such an arrangement, the first fan unit may be operative to draw air horizontally through the top plenum. In a further arrangement, the second fan unit is operative to displace air vertically through spaces between the plurality of electronic boards. The second fan unit may be disposed above or below the electronic boards. In one arrangement, the second fan unit is disposed in the top plenum above the plurality of electronic boards and is operative to draw air through spaces between those electronic boards.

In one arrangement, at least one of the first and second fan units includes an assembly having a plurality of individual fans. In such an arrangement, each individual fan of the fan assembly may be removable for exchange without terminating operation of the remaining fans of the assembly. Further, the operation of each fan in such a fan assembly may be individually controllable. That is, different fans in a single assembly may be operated at different speeds. In another arrangement, one of the fan units may be removed from the chassis without terminating the operation of the other fan unit. To facilitate such removal, the chassis may include a first access opening for accessing one of the first and second fan units and a second access opening for accessing the other of the first and second fan units. Such access openings may each open into the top plenum and may be disposed on separate walls of the chassis. Further, both fan units may be removable through a single access opening.

According to another aspect, a utility is provided for use in an electronics chassis. The utility includes displacing air vertically between a plurality of electronics boards disposed within an electronics chassis. This air is displaced using a horizontally mounted fan unit. The air is output into a plenum disposed above the plurality of electronics boards, where the air is exhausted from the plenum through an air outlet extending through a vertical sidewall of the electronics chassis. More specifically, the air is exhausted using a vertically mounted fan unit.

DETAILED DESCRIPTION

Reference will now be made to the accompanying drawings, which assist in illustrating the various pertinent features of the present invention. Although described primarily herein in conjunction with providing airflow in an ATCA (Advanced Telecom Computing Architecture) chassis, it should be expressly understood that certain aspects of the invention may be applicable to other applications where improved airflow within an electronic enclosure is desired. In this regard, the following description is presented for purposes of illustration and description. Furthermore, the description is not intended to limit the embodiments to the forms disclosed herein. Consequently, variations in modifications consistent with the following teachings, and skill and knowledge of the relevant art, are within the scope of the present application.

Figure 1:
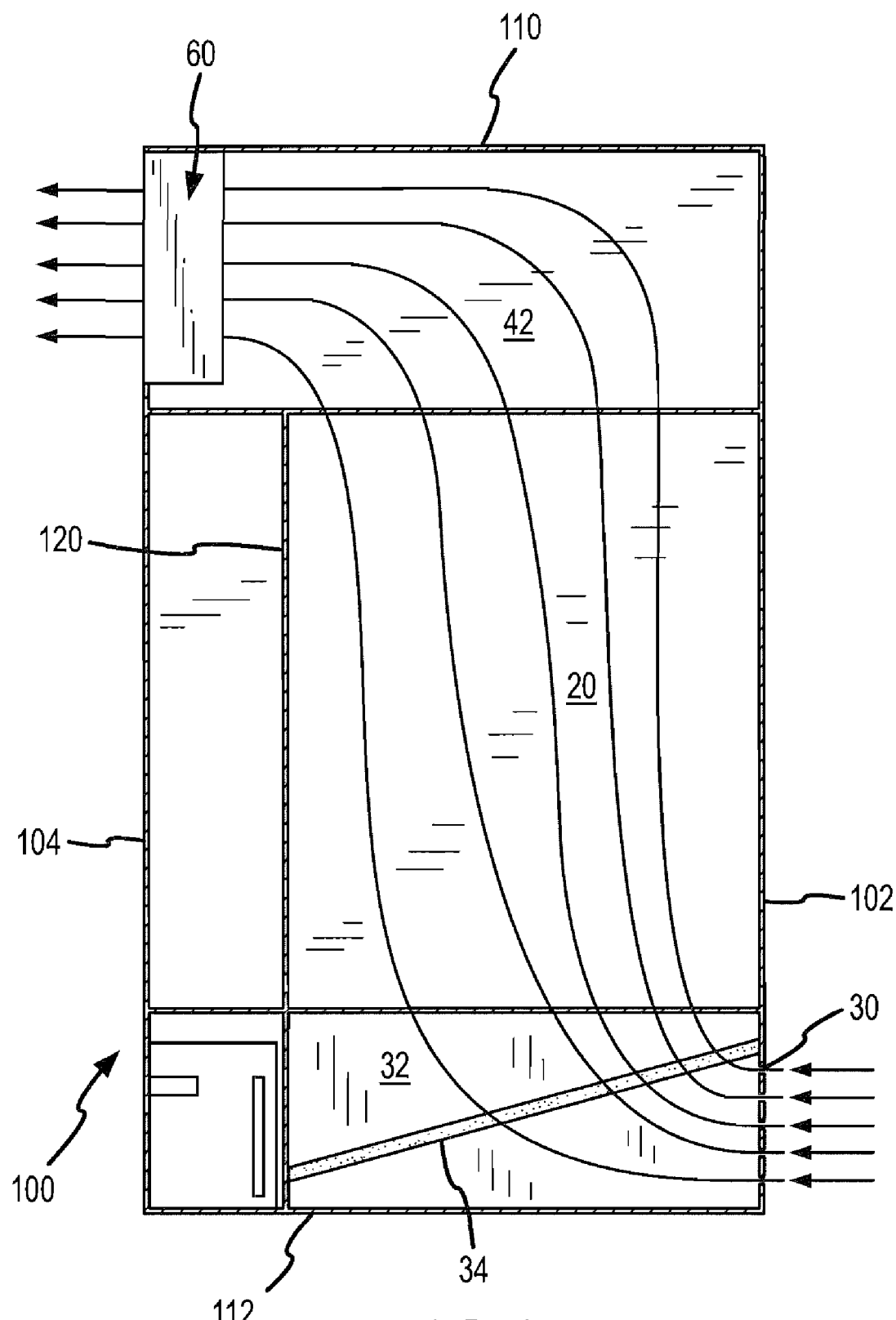
FIG. 1 illustrates a side view of a prior art electronics chassis.
Figure 2:
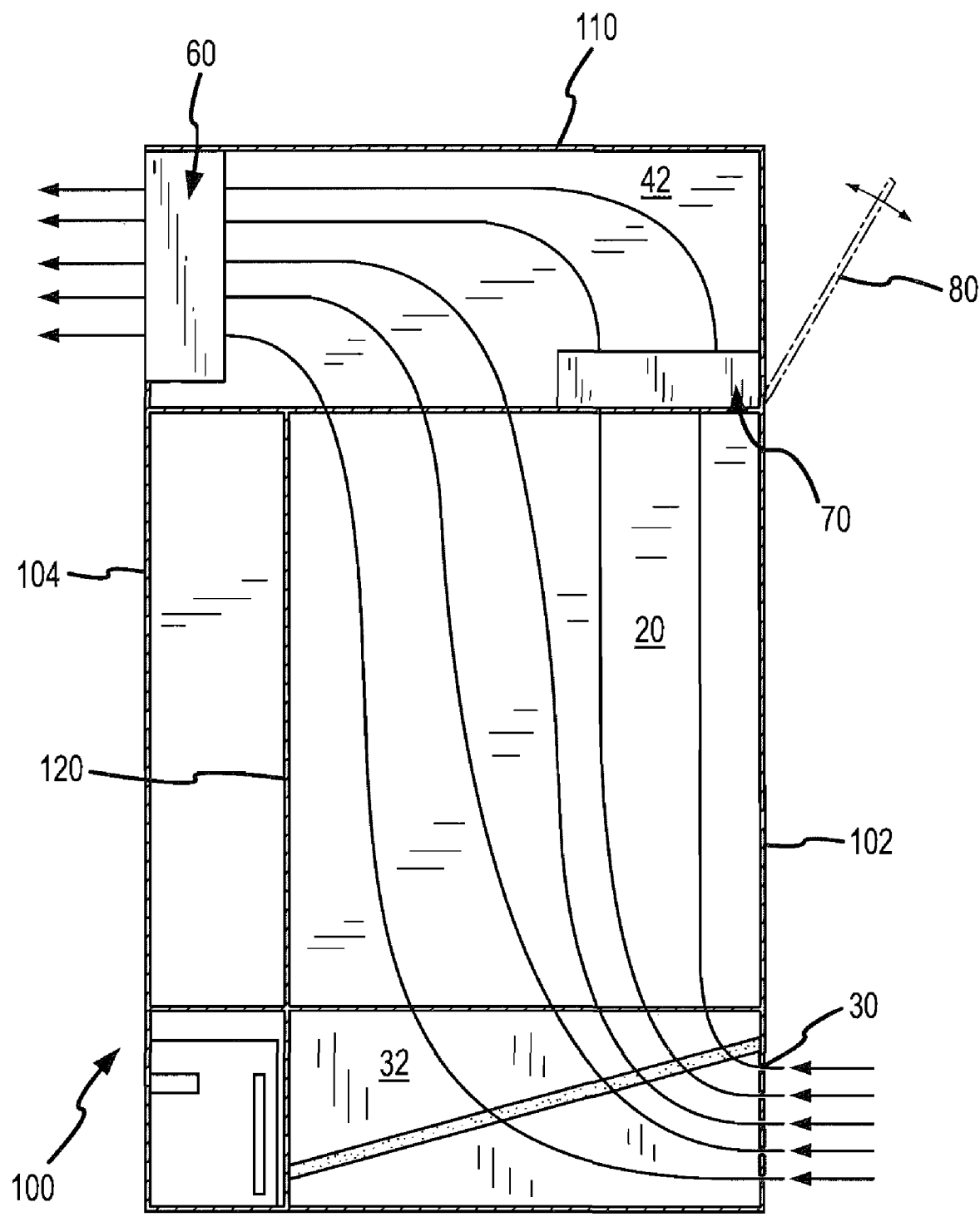
FIG. 2 illustrates a side view of one embodiment of electronics chassis having improved airflow characteristics.
Figure 3:
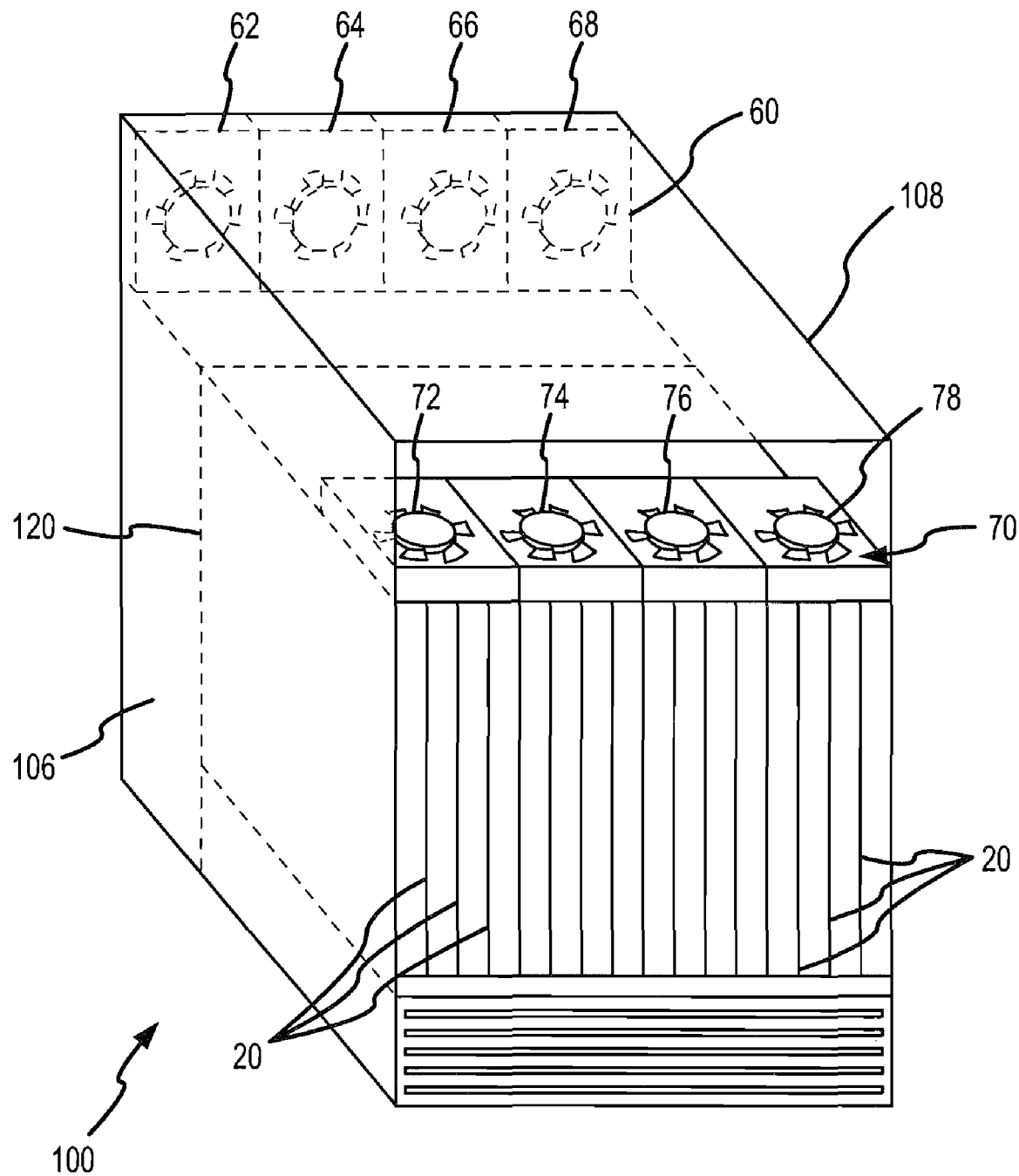
FIG. 3 illustrates a perspective view of electronics chassis of FIG. 2.

FIGS. 1-3 variously illustrate cross-sectional side and perspective views of an exemplary electronics chassis 100. In the embodiment illustrated in FIG. 1, the chassis 100 is a chassis that conforms to ATCA specifications and includes a metal box having four vertical sidewalls that house a plurality of electronic boards or "blades." Specifically, the chassis 100 includes a front wall 102, a back wall 104, two sidewalls 106 and 108, as well as top and bottom walls 110 and 112. The chassis 100 may be composed of any suitable material including, but not limited to, plastic, steel and aluminum. Further, the physical dimensions of the chassis 100 may also vary according to intended use and/or chassis specific specifications.

As shown in FIG. 3, the chassis 100 houses a plurality of electronic cards or boards 20. More specifically, illustrated chassis 100 houses sixteen electronic boards 20 that are disposed in parallel fashion and extend from the front wall 102 towards the backplane 120 that is spaced from the back wall 104. In another arrangement, the electronic boards 20 may extend from the front wall 102 to the back wall 104. In another dimension, the electronic boards extend vertically from the top of a lower plenum 32 to the bottom of an upper plenum 42. Further, the electronic boards 20 are spaced relative to one another such that air may flow between each individual board for cooling purposes, as will be discussed herein.

As will be appreciated, the electronic boards 20 generate heat during operation and are cooled by air flowing through the chassis 100. In some instances, such airflow may be due to natural convection within the electronics chassis 100. In such instances, no fans are utilized to move air through the chassis. More commonly, one or more fan units 60 are utilized to draw air through the electronics chassis for cooling purposes. In this regard, the fan units 60 may be operative to draw ambient air through an inlet grate 30, into a lower plenum 32, through one or more filters 34, vertically between the electronics boards 20 into an upper plenum 42, through the fans 60 and out of the chassis 100. As the air passes across components on the electronics board 20, heat is carried away. Chassis that utilize one or more fans may be considered forced convection systems.

FIG. 1 illustrates an airflow path that is utilized by prior art chassis. As shown, ambient air enters the chassis 100 near the bottom wall 112 through the inlet grate 30, which is disposed through the front wall 102 of the chassis 100. This air enters the lower plenum 32, turns 90 degrees upward, flows across and between the electronics boards 20, enters the upper plenum 42, again turns 90 degrees and flows through the fan unit 60 such that it is exhausted from the chassis 100. In the embodiment shown, the lower plenum 32 includes a slanted filter 34, which is operative to at least partially distribute airflow along the length of the boards 20 such that more even airflow is achieved. However, as shown in FIG. 1, resultant airflow through the chassis 100, which utilizes a single exhaust fan unit 60 located in the upper plenum 42, is a Z-shaped airflow. In this regard, it will be noted that certain portions of the electronics board 20 receive little airflow and, thus, little effective cooling. Specifically, portions of the electronic boards 20 that are disposed in the upper right hand portion of the chassis 100 as illustrated in FIG. 1 receive little airflow and are in what may be termed a 'dead zone'. Accordingly, cooling of components disposed on the electronics boards 20 in such dead zones may be problematic.

Stated otherwise, prior airflow configurations chassis may not account for hotspots on individual boards 20 but rather utilizes an average airflow approach. However, as is typical in all electronics boards, heat generation on an individual board is generally uneven. That is, different components, which may be located on different regions of individual boards, produce a majority of heat for the board. In the arrangement of FIG. 1, if these hotspots on the boards are located within a dead zone, they may receive inadequate airflow.

In accordance with the embodiments described herein, enhanced cooling within an electronics chassis 100 is provided using multiple fan units 60, 70. See FIGS. 2-7. Although the embodiments disclosed herein each utilize multiple fan units 60, 70 to provide cooling within an electronics chassis 100, the multiple fan units 60, 70 are generally disposed within the chassis 100 such that the chassis may be stacked with other chassis if desired. That is, multiple fan units 60, 70 do not interfere with stacking of multiple chassis. Of note, it is a common practice to stack multiple chassis 100 to reduce the amount of room required for such chassis. Further, it will be noted that multiple sets of stacked chassis may be disposed side by side. In this regard, the only available surfaces for inletting and exhausting air and/or accessing the fan units 60, 70 for servicing purposes are typically the front and rear walls 102, 104 of the electronics chassis 100.

As shown in the embodiment of FIGS. 2-5, at least a second fan unit 70 is disposed in the upper plenum 42 above the electronics boards 20. More specifically, the second fan unit 70 is disposed in a horizontal relation above the generally vertical boards 20. During operation, the second fan unit 70 is operative to draw air from the lower plenum 32 through the boards 20 and into the upper plenum 42 where it may be exhausted by the first fan unit 60. The first fan unit 60 is oriented substantially adjacent to an air outlet of the chassis 100. Alternatively, the first fan unit 60 may form a portion of the outside surface of the electronics chassis 60. In either case, the first fan 60 is vertically oriented relative to the vertical back wall 104 of the chassis 100.

Use of the second fan unit 70 in conjunction with the first fan unit 60 allows for increasing the airflow over the surface of the boards 20. That is, the use of the first and second fan units 60, 70, allows for increasing the total airflow into the bottom plenum 32 and thereby increases the overall thermal cooling capacity of the chassis 100.

Referring to FIG. 3, it is noted that the first and second fan units 60, 70 may be represented as fan assemblies that include a plurality of fans. In this regard, each fan unit 60, 70 may include multiple fans 62-68 and 72-78, respectively, that may extend across the width of the chassis 100 between the first and second sidewalls 106, 108. The use of first and second fan units 60, 70 provide a redundancy for the system. Further, the use of multiple fans in each of the first and second fan units 60, 70, also provides redundancy for each fan unit 60, 70. That is, one or more fans in either fan unit 60, 70 may fail without affecting the operation of the remaining fans in the unit.

Figure 4:
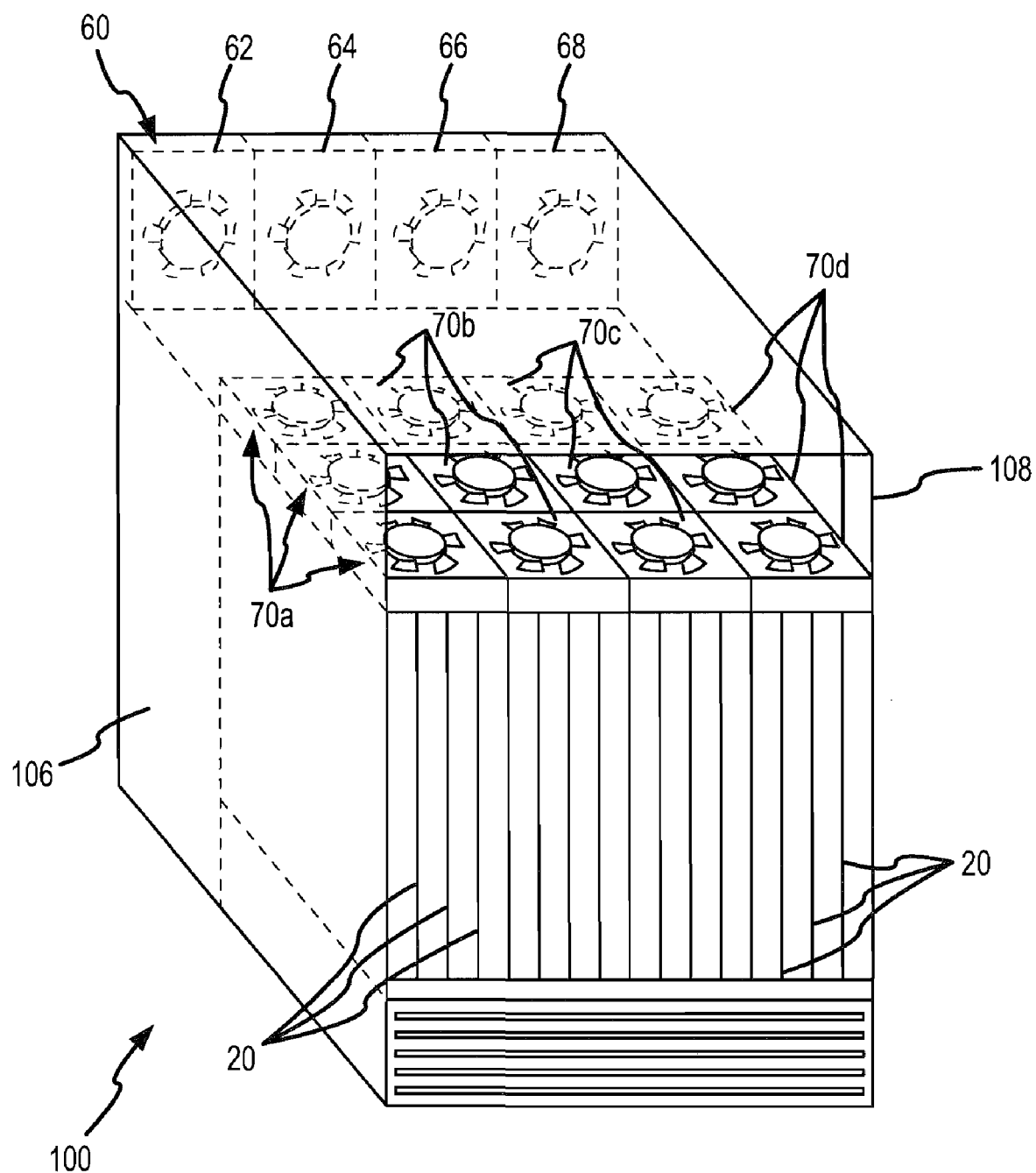
FIG. 4 illustrates perspective view of a second embodiment of electronics chassis having improved airflow characteristics.

To provide more individualized airflow through the electronic boards 20, additional horizontal fans may be utilized. For instance, the entire surface above the plurality of boards 20 within the upper plenum 42 may be covered with horizontal fan units 70a, 70b, 70c, 70d (See FIG. 4). Alternatively, fans may also be disposed within the lower plenum 32 (not shown). As shown in FIG. 4, a number of horizontal fan units 70a-d may be linearly aligned to provide cooling over the entire surface of the boards.

To better provide individual cooling of individual hotspots, individual fans in each fan unit 60, 70 may be individually controlled. That is, a first fan of a horizontal fan unit (e.g., 70a) disposed above a known hotspot within one or more boards 20 may be operated at a higher speed than an adjacent fan of the same fan unit. Each fan unit may also be operated different speed based on cooling requirements.

Figure 5:
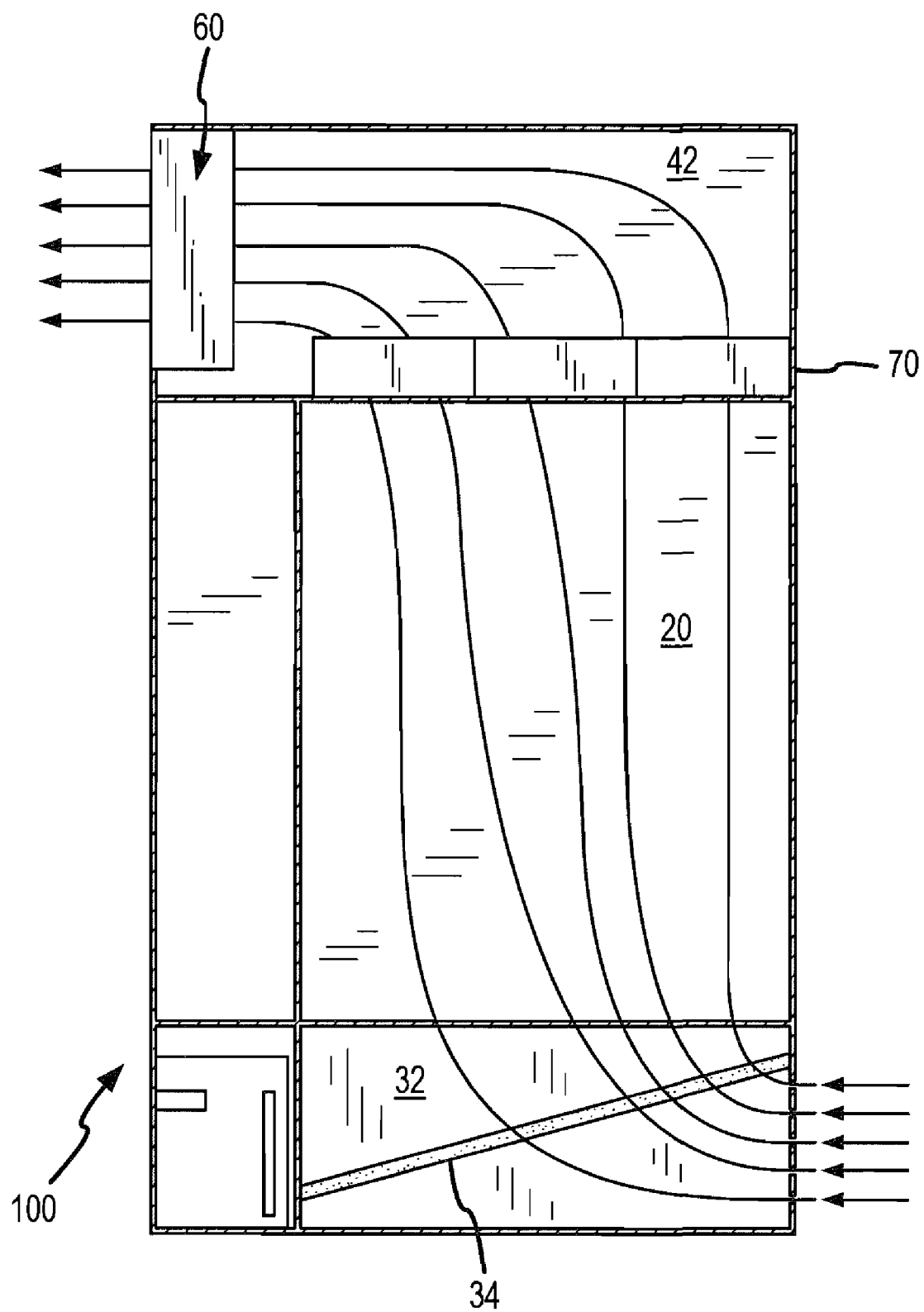
FIG. 5 illustrates a side view of the electronics chassis of FIG. 4.

FIG. 5 illustrates the improved airflow through the electronics chassis 100 that may be obtained utilizing the horizontal fan unit 70 in conjunction with a vertical fan unit 60. Generally, the horizontal fan unit 70 is operative to draw air through the electronic boards 20 including through areas that may have been previously inadequately cooled (e.g., dead zones). In this regard, the horizontal fan unit 70 displaces air into the upper plenum 42 from where the air may then be evacuated from the chassis 100 by the vertical fan unit 60.

Figure 6:
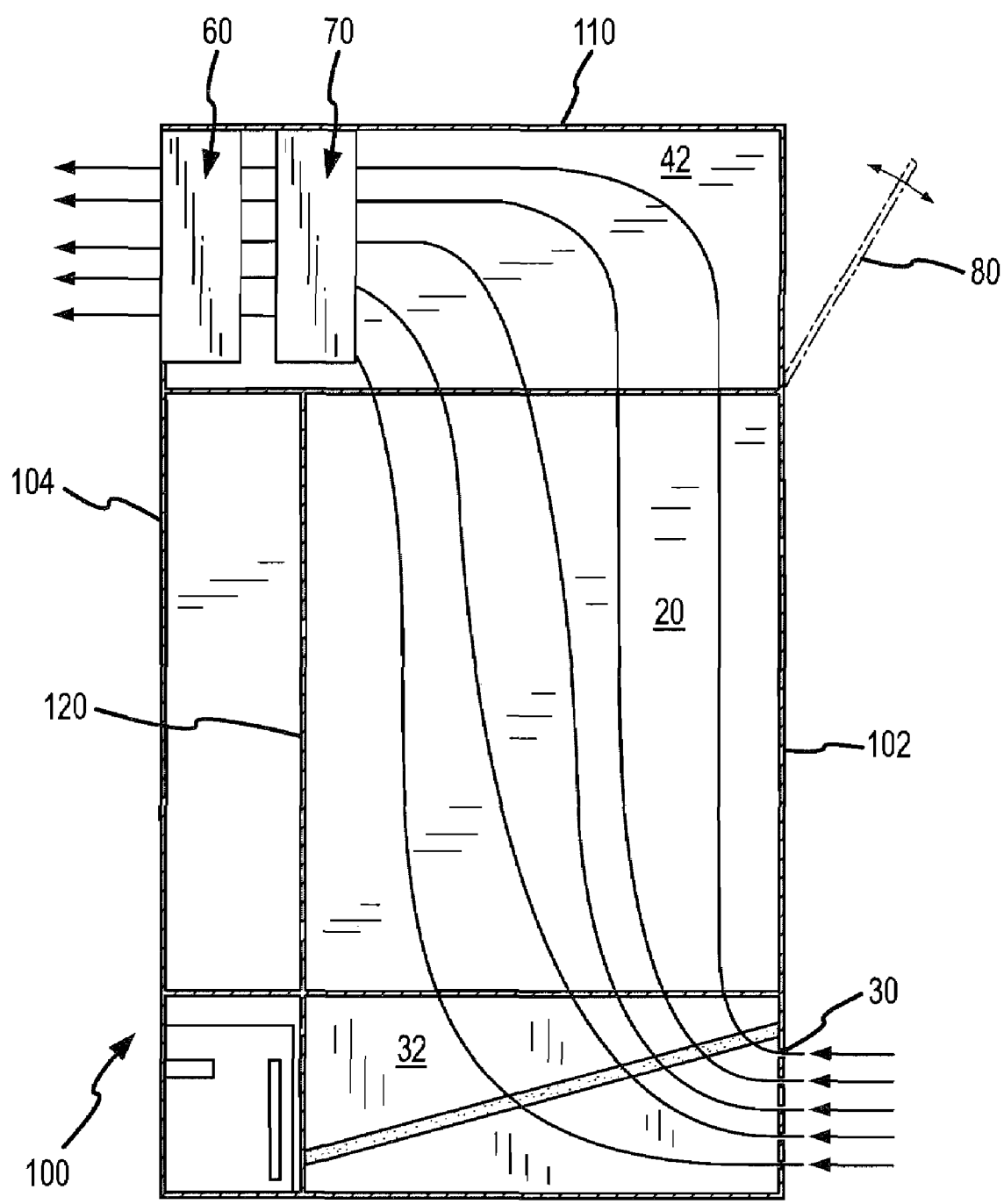
FIG. 6 illustrates a further embodiment of electronics chassis having improved airflow characteristics.

FIG. 6 illustrates a further embodiment where multiple fan units 60, 70 are utilized to increase the airflow through electronics chassis 100. In this embodiment, the first and second fan units 60, 70 are disposed in series and are each disposed in a vertical relation proximate to the rear wall 104 of the chassis 100. As shown, the increased airflow resulting from the inclusion of the second fan unit 70 improves the airflow over the electronics boards 20.

Similar to the embodiment of FIGS. 2-5, each fan unit 60, 70 in the embodiment of FIG. 6 may include multiple fans (e.g., 62-68 and 72-78) that may extend across the width of the chassis 100 between the sidewalls thereof. Again the first and second fan units 60, 70 provide a fan unit redundancy for the cooling system of the chassis 100 while the use of multiple fans in each fan unit provides a redundancy for each fan unit 60, 70. To further improve the redundancy of the chassis 100 of FIG. 6 the fan units 60, 70 may be accessed through separate access openings. In this regard, the first fan unit 60 may be accessed for servicing purposes through an access opening in the back wall 104 of the chassis 100 while the second fan unit 70 may be accessed for servicing purposes through an access opening (e.g., access panel 80) in the front wall of the chassis 100. Importantly, this may allow for servicing one fan unit (e.g., 60 or 70) while the other fan unit continues providing cooling for the chassis 100.

In any embodiment, each fan unit 60, 70 and/or individual fans in those units may be hot-swappable to facilitate removal and replacement of the fans. That is, each fan 62-68 in the first fan unit 60 may be removable and replaceable with a like sized fan without ceasing the operation of the remaining fans in the first fan unit 60. Further, the entire fan unit 60 may be removable and replaceable. That is, the first fan unit 60 may be a field replaceable unit (FRU) that may be removed and replaced while the electronics within the chassis 100 are operating. As will be appreciated, continued operation of the second fan unit 70 during removal and/or replacement of the first fan unit 60 allows for continued cooling during such servicing. Likewise, the fans 72-78 of the second fan unit 78 may each be individually replaceable and/or the second fan unit 70 may be a FRU.

To further facilitate removal and replacement of the individual fans and/or the fan units 60, 70, each fan unit 60, 70, may be accessible from a common opening into the chassis 100. Alternatively, each fan unit 60, 70 may be accessible through an individual opening into the chassis 100. For instance, the second fan unit 70 or its individual fans 72-78 may be accessible through a first access panel 80 (as shown in phantom in FIGS. 2 and 6) located through the front wall 102 of the chassis 100. In this regard, the second fan unit 70 may be accessed and removed without disturbing the first fan unit 60. Likewise, the first fan unit 60 may be accessible through the back wall 104 of the chassis 100, for example, through a second access panel such that one or all the fans 62-68 may be removed. Alternatively, the first fan unit 60 and/or its individual fans 62-68 may form a portion of the outside surface of the chassis 100 and may be removable from the chassis 100 without accessing the upper plenum 42. In either case, the fans 62-68 of the first fan unit may be accessible and replaceable without disturbing the second fan unit 70. As may be appreciated, such an arrangement may be particularly desirable in arrangements where the chassis 100 is accessible from both the front and rear. However, it will be appreciated that, to allow for servicing through a single side of the chassis (e.g., front or rear), an access opening may be sized to allow for removal of both fan units 60, 70 or the individual fans in those units. As may be appreciated, such an arrangement may require the removal of one fan unit or an individual fan to access the other fan unit or an individual fan behind it.

Figure 7:
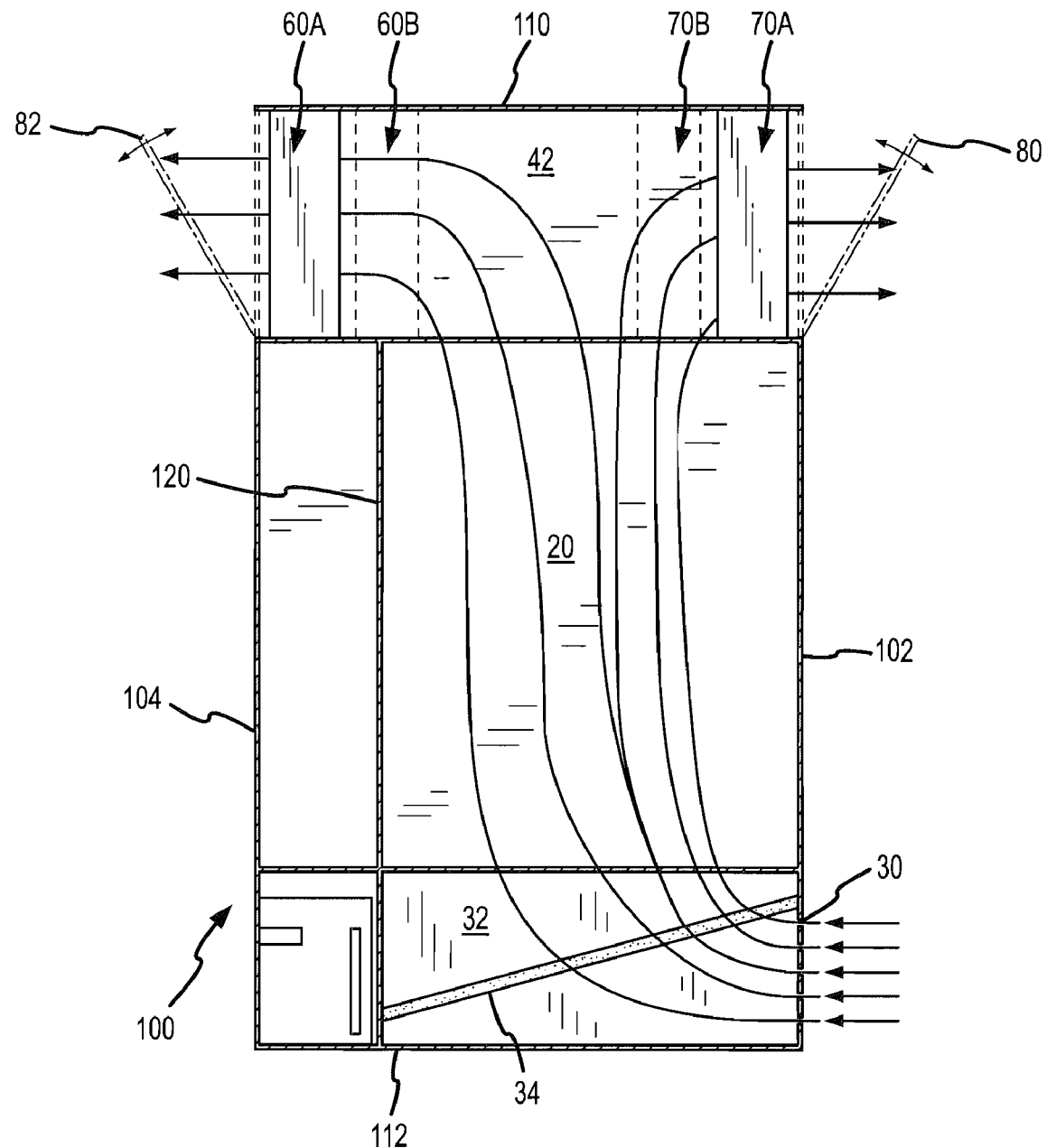
FIG. 7 illustrates a yet further embodiment of electronics chassis having improved airflow characteristics.

In another arrangement, illustrated in FIG. 7, an electronics chassis 100 is provided that includes first and second air outlets disposed on the front and rear walls 102, 104 in the upper plenum 42. That is, air outlets from the upper plenum 42 exit both the front and rear of the chassis 100. Accordingly, first and second fan units 60a, 70a, may be positioned adjacent (e.g., vertically) relative to each outlet to provide enhanced cooling for the chassis 100. As discussed above, these first and second fan units may be individually accessible through access openings in the front and rear walls 102, 104 of the chassis 100, for instance via first and second access panels 80, 82. Likewise, the fan units 60a, 70a, may include a plurality of individual fans (e.g., extending across the width of the chassis 100), which may each be hot swappable and/or the entire fan units 60a, 70a may be hot swappable. To provide additional redundancy, additional fan units may be utilized. For instance, first and second parallel fan units 60a, 60b and 70a, 70b may be utilized. Each such unit may be a field replaceable unit (FRU) and/or may include individually replaceable fans. In this regard, the front fan FRU 60a, 70a may have to be removed to access the rear fan FRU 60b, 70b. In another arrangement each parallel pair of fan units 60a, 60b and 70a, 70b includes multiple fans disposed across the width of the chassis 100. In another arrangement, each fan unit may include a pair of fans disposed in series.

The foregoing description has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. For instance, it will be appreciated that fans may also be disposed within the lower plenum 32 in addition to disposing fans within the upper plenum 42. Further, multiple sets of fans may be disposed in each plenum 32, 42 to provide yet further enhanced airflow for cooling purposes.

The embodiments described hereinabove are further intended to explain best known modes of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. An electronics chassis system comprising:
   an enclosure having four vertical sidewalls, a top surface and a bottom surface, wherein an interior of the enclosure includes an upper plenum, a lower plenum and a section disposed between the plenums for receiving a plurality of electronics boards;
   a first access opening to the upper plenum;
   a first fan unit, wherein the first fan unit is selectively removable through the first access opening and wherein the first fan unit is aligned with an air outlet through a first of the vertical sidewalls to move air in a direction substantially normal to the first vertical sidewall;
   a second access opening to the upper plenum; and
   a second fan unit, wherein the second fan unit is selectively removable through the second access opening and wherein the second fan unit is disposed substantially normal to the vertical sidewalls to move air in a direction substantially parallel to the vertical sidewalls.

2. The system of claim 1, wherein the first access opening is disposed through a first vertical sidewall.

3. The system of claim 2, wherein the second access opening is disposed through a second, vertical sidewall.

4. The system of claim 3, wherein the first and second vertical sidewalls are nonadjacent.

5. The system of claim 1, wherein the air outlet forms at least a portion of the first access opening.

6. The system of claim 1, wherein the first fan unit and the second fan unit both draw air into the upper plenum and the first fan unit exhausts air from the plenum through the air outlet.

7. The system of claim 1, wherein at least one of the first and second fan units comprises a fan assembly including a plurality of fans.

8. The system of claim 7, wherein each individual fan of the fan assembly is removable for exchange without terminating operation of remaining fans of the fan assembly.

9. The system of claim 7, wherein operation of each fan in the fan assembly is individually controllable.

10. The system of claim 9, wherein the plurality of fans are disposed in series.

11. An electronics chassis system comprising:
    an enclosure having four vertical sidewalls, a top surface and a bottom surface, wherein an interior of the enclosure includes an upper plenum, a lower plenum and a section disposed between the plenums for receiving a plurality of electronics boards;
    a first access opening to the upper plenum, wherein the first access opening is disposed through a first vertical sidewall;

a first fan unit, wherein the first fan unit is selectively removable through the first access opening and wherein the first fan unit is aligned with an air outlet through a first of the vertical sidewalls;

a second access opening to the upper plenum; and a second fan unit, wherein the second fan unit is selectively removable through the second access opening and wherein the second fan unit is aligned with an air outlet through a second of the vertical sidewalls.

12. The system of claim 11, wherein the first fan unit comprises a fan assembly including a plurality of fans and wherein an operating speed of at least a number of the fans in the fan assembly is individually controllable.

13. The system of claim 12, wherein each individual fan of the fan assembly is removable for exchange without terminating operation of remaining fans of the fan assembly.

14. The system of claim 12, wherein operation of each fan in the fan assembly is individually controllable based on cooling requirements within the enclosure.

15. The system of claim 11, wherein the second fan unit comprises a fan assembly including a plurality of fans and wherein an operating speed of at least a number of the fans in the fan assembly is individually controllable.

16. The system of claim 15, wherein each individual fan of the fan assembly is removable for exchange without terminating operation of remaining fans of the fan assembly.

17. The system of claim 15, wherein operation of each fan in the fan assembly is individually controllable based on cooling requirements within the enclosure.

18. The system of claim 11, wherein the first and second vertical sidewalls are nonadjacent.

19. The system of claim 11, wherein the air outlets form at least portions of the first and second, access openings.

20. An electronics chassis system comprising:

a chassis for holding a plurality of electronics boards disposed in parallel, wherein the chassis comprises four vertical sidewalls, a top surface and a bottom surface an interior of the chassis includes an upper plenum, a lower plenum, and a section disposed between the plenums for receiving the electronics boards;

a first access opening to the upper plenum;

a first fan unit, wherein the first fan unit is selectively removable through the first access opening and wherein the first fan unit is aligned with an air outlet through a first of the vertical sidewalls to move air in a direction substantially normal to the first vertical sidewall;

a second access opening to the upper plenum; and a second fan unit, wherein the second fan unit is selectively removable through the second access opening and wherein the second fan unit is disposed substantially normal to the vertical sidewalls to move air in a direction substantially parallel to the vertical sidewalls;

wherein the second fan unit comprises a fan assembly including a plurality of fans and wherein an operating speed of at least a number of the fans in the fan assembly is individually controllable.

21. The system of claim 20, wherein the first fan unit is vertically aligned relative to the air outlet, wherein the first fan unit is operative to draw air horizontally through the upper plenum.

22. The system of claim 20, wherein the second fan unit is operative to displace air vertically through spaces between the plurality of electronics boards.

23. The system of claim 22, wherein the second fan unit is disposed in the upper plenum above the plurality of electronics boards, wherein the second fan unit draws air through the spaces.

24. The system of claim 20, wherein each individual fan of the fan assembly is removable for exchange without terminating operation of remaining fans of the fan assembly.

25. The system of claim 20, wherein operation of each fan in the fan assembly is individually controllable based on cooling requirements within the chassis.

26. The system of claim 16, wherein the first fan unit comprises a first plurality of fans, wherein each of the first and second fan units is removable without terminating operation of the other of the first and second fan units.

27. The system of claim 20, wherein the first fan unit comprises a fan assembly including a plurality of fans, the operating speed of at least a number of the fans in the fan assembly being individually controllable.

* * * * *